United States Patent
Feng et al.

(10) Patent No.: US 11,614,690 B2
(45) Date of Patent: Mar. 28, 2023

(54) METHODS OF TUNING PROCESS MODELS

(71) Applicant: ASML NETHERLANDS B.V., Veldhoven (NL)

(72) Inventors: Mu Feng, San Jose, CA (US); Mir Farrokh Shayegan Salek, Santa Clara, CA (US); Dianwen Zhu, San Jose, CA (US); Leiwu Zheng, San Jose, CA (US); Rafael C. Howell, Santa Clara, CA (US); Jen-Shiang Wang, Sunnyvale, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 743 days.

(21) Appl. No.: 16/478,489

(22) PCT Filed: Jan. 24, 2018

(86) PCT No.: PCT/EP2018/051669
§ 371 (c)(1),
(2) Date: Jul. 17, 2019

(87) PCT Pub. No.: WO2018/138123
PCT Pub. Date: Aug. 2, 2018

(65) Prior Publication Data
US 2019/0369498 A1     Dec. 5, 2019

Related U.S. Application Data

(60) Provisional application No. 62/451,048, filed on Jan. 26, 2017.

(51) Int. Cl.
G05B 19/418    (2006.01)
G03F 7/20    (2006.01)

(52) U.S. Cl.
CPC ....... *G03F 7/705* (2013.01); *G05B 19/41875* (2013.01); *G05B 2219/33286* (2013.01);
(Continued)

(58) Field of Classification Search
CPC ................. G03F 7/70441; G03F 7/705; G05B 19/41875; G05B 2219/33286; G05B 2219/45028; G05B 2219/49087
See application file for complete search history.

(56) References Cited

U.S. PATENT DOCUMENTS 5,229,872 A    7/1993   Mumola
5,296,891 A    3/1994   Vogt et al.
(Continued)

FOREIGN PATENT DOCUMENTS

CN    101258498    9/2008
CN    102057329    5/2011
(Continued)

OTHER PUBLICATIONS

International Search Report and Written Opinion issued in corresponding PCT Patent Application No. PCT/EP2018/051669, dated Apr. 25, 2018.
(Continued)

*Primary Examiner* — Yuhui R Pan
(74) *Attorney, Agent, or Firm* — Pillsbury Winthrop Shaw Pittman LLP

(57) ABSTRACT

Methods of constructing a process model for simulating a characteristic of a product of lithography from patterns produced under different processing conditions. The methods use a deviation between the variation of the simulated characteristic and the variation of the measured characteristic to adjust a parameter of the process model.

20 Claims, 12 Drawing Sheets

(52) U.S. Cl.
CPC .............. *G05B 2219/45028* (2013.01); *G05B 2219/49087* (2013.01)

(56) References Cited

U.S. PATENT DOCUMENTS

| | | | |
|---|---|---|---|
| 5,523,193 | A | 6/1996 | Nelson |
| 6,046,792 | A | 4/2000 | Van Der Werf et al. |
| 7,587,704 | B2 | 9/2009 | Ye et al. |
| 8,318,391 | B2 | 11/2012 | Ye et al. |
| 9,026,956 | B1 | 5/2015 | Chang et al. |
| 2007/0031745 | A1 | 2/2007 | Ye et al. |
| 2009/0157360 | A1 | 6/2009 | Ye et al. |
| 2009/0300573 | A1* | 12/2009 | Cao .......................... G06F 30/20 716/50 |
| 2012/0021343 | A1 | 1/2012 | Ye et al. |
| 2013/0179847 | A1* | 7/2013 | Hansen ............... G03F 7/70125 716/54 |
| 2015/0106771 | A1* | 4/2015 | Chang .................... G03F 7/705 716/51 |
| 2016/0313653 | A1 | 10/2016 | Mink et al. |

FOREIGN PATENT DOCUMENTS

| | | |
|---|---|---|
| CN | 103843124 | 6/2014 |
| CN | 104516206 | 4/2015 |
| CN | 104583872 | 4/2015 |
| CN | 105900016 | 8/2016 |
| WO | 2009148972 | 12/2009 |

OTHER PUBLICATIONS

Taiwanese Office Action issued in corresponding Taiwanese Patent Application No. 107102699, dated Sep. 26, 2018.

Kim, Sung-Man, et al.: "High-precision self-tool CD matching with focus-target assist pattern by computational ways", Proc. of SPIE, vol. 9050, Apr. 2, 2014.

Chinese Office Action issued in corresponding Chinese Patent Application No. 201880008283.0, dated Dec. 1, 2020.

\* cited by examiner

METHODS OF TUNING PROCESS MODELS

CROSS-REFERENCE TO RELATED APPLICATION

This application is the U.S. national phase entry of PCT Patent Application No. PCT/EP2018/051669, which was filed on Jan. 24, 2018, which claims the benefit of priority of U.S. Provisional Application No. 62/451,048, filed Jan. 26, 2017, and entitled "Methods of Tuning Process Models," the disclosure of which is incorporated herein in its entirety by reference.

TECHNICAL FIELD

The description herein relates to methods and systems for process modeling.

BACKGROUND

A lithographic projection apparatus can be used, for example, in the manufacture of integrated circuits (ICs). In such a case, a patterning device (e.g., a mask) may contain or provide a circuit pattern corresponding to an individual layer of the IC ("design layout"), and this circuit pattern can be transferred onto a target portion (e.g. comprising one or more dies) on a substrate (e.g., silicon wafer) that has been coated with a layer of radiation-sensitive material ("resist"), by methods such as irradiating the target portion through the circuit pattern on the patterning device. In general, a single substrate contains a plurality of adjacent target portions to which the circuit pattern is transferred successively by the lithographic projection apparatus, one target portion at a time. In one type of lithographic projection apparatuses, the circuit pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the circuit pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the circuit pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred circuit pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, lithography is a central step in the manufacturing of ICs, where patterns formed on substrates define functional elements of the ICs, such as microprocessors, memory chips etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from an illumination source (e.g., deep-ultraviolet (DUV) or ultra-violet (EUV)), creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, multi-patterning, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

Disclosed herein is a method comprising: obtaining simulated characteristics by simulating, under a plurality of processing conditions, characteristics of a product of lithography using a process model comprising a parameter, determining a variation of the simulated characteristics; obtaining measured characteristics by measuring the characteristics of the product, from patterns produced under the plurality of processing conditions; determining a variation of the measured characteristics; determining a first deviation between the variation of the simulated characteristics and the variation of the measured characteristics; and adjusting the parameter based on the first deviation.

According to an embodiment, the method further comprises adjusting a processing condition based on simulation by the process model.

According to an embodiment, the method further comprises selecting a group of locations for inspection on a substrate produced by the lithography based on simulation by the process model.

According to an embodiment, the plurality of processing conditions are selected randomly.

According to an embodiment, the plurality of processing conditions comprise a nominal processing condition.

According to an embodiment, the variation of the measured characteristics is selected from a group consisting of a standard deviation of the measured characteristics, a variance of the measured characteristics, and a range of the measured characteristics.

According to an embodiment, the variation of the simulated characteristics is selected from a group consisting of a standard deviation of the measured characteristics, a variance of the measured characteristics, and a range of the measured characteristics.

According to an embodiment, adjusting the parameters comprises determining values of the parameters that cause a function of the first deviation to be at a local or global extremum.

According to an embodiment, adjusting the parameter is based on a combination of the first deviation, and a second deviation between the simulated characteristics and the measured characteristics under a same processing condition.

According to an embodiment, the plurality of processing conditions comprise a characteristic of a source of a lithographic apparatus, a characteristic of projection optics of a lithographic apparatus, and a characteristic of a patterning device with an arrangement of features thereon that represent a design layout.

According to an embodiment, the characteristics of the product comprise a characteristic of an image.

According to an embodiment, the image is an aerial image, a resist image or an etched image.

According to an embodiment, the characteristics of the product comprise a process window of a feature of a design layout.

According to an embodiment, the characteristics of the product comprise a statistical parameter of a feature at a plurality of locations.

Disclosed herein is a method comprising: obtaining a plurality of first deviations, each of which being between a variation of simulated characteristics of a product of lithography and a variation of measured characteristics of the product of lithography, wherein the simulated characteristics are obtained by simulating characteristics of the product using a process model comprising a parameter; constructing a plurality of cost functions, the cost functions being combinations of the plurality of first deviations; adjusting the parameter of the process model by using the cost functions.

According to an embodiment, the method further comprises adjusting a processing condition based on simulation by the process model.

According to an embodiment, the method further comprises selecting a group of locations for inspection on a substrate produced by the lithography based on simulation by the process model.

According to an embodiment, the variations are across a same set of processing conditions.

According to an embodiment, the method further comprises obtaining a second deviation between the simulated characteristics and the measured characteristics under a same processing condition, wherein the cost functions are combinations of the plurality of first deviations and the second deviation.

According to an embodiment, at least one of the cost functions is not affected by all the parameters.

According to an embodiment, adjusting the parameters comprises determining values of the parameters that cause the cost functions to be at local or global extrema.

According to an embodiment, the characteristics of the product comprise a characteristic of an image.

According to an embodiment, the image is an aerial image, a resist image or an etched image.

According to an embodiment, the characteristics of the product comprise a process window of a feature of a design layout.

According to an embodiment, the characteristics of the product comprise a statistical parameter of a feature at a plurality of locations.

Disclosed herein is a computer program product comprising a non-transitory computer readable medium having instructions recorded thereon, the instructions when executed by a computer implementing any of the methods above.

DETAILED DESCRIPTION

Figure 1:
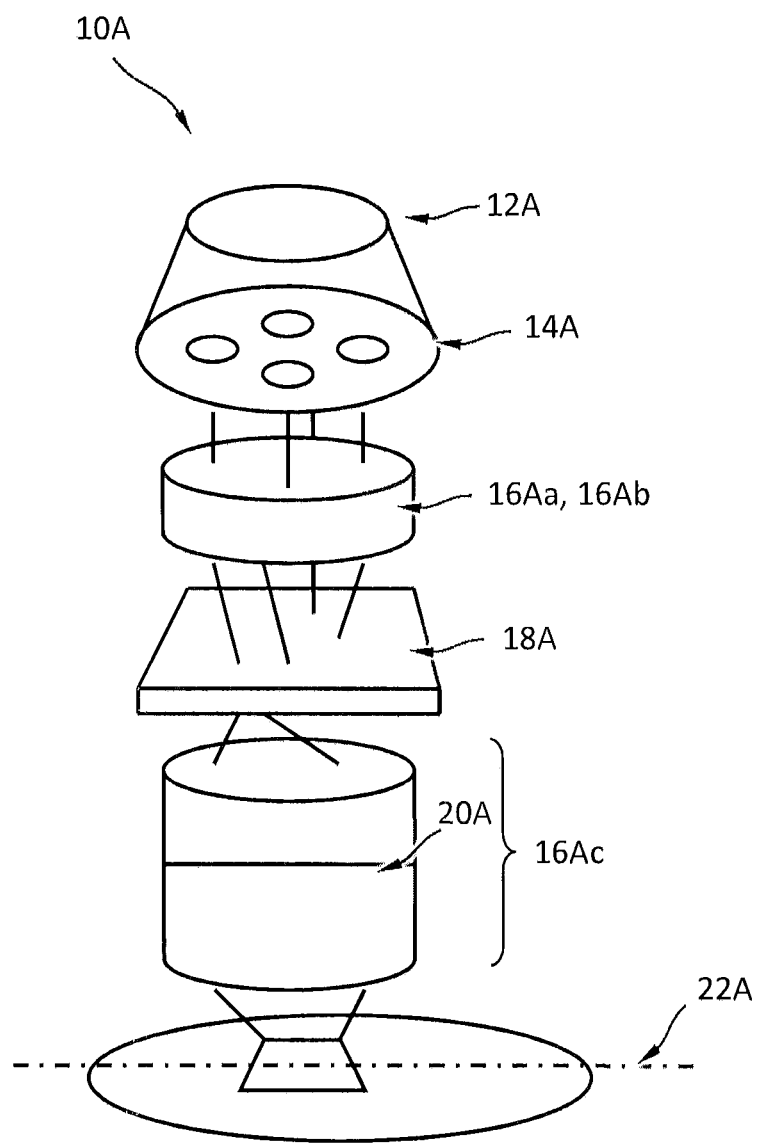
FIG. 1 shows a block diagram of various subsystems of a lithography system.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. One or more of the design rule limitations may be referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such minor arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 14A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin($\Theta_{max}$), n is the Index of Refraction of the media between the last element of projection optics and the substrate, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level (e.g., on the surface of the resist or inside the resist; namely 2D or 3D intensity distribution). A resist layer on the substrate is exposed and the aerial image is transferred to the resist layer as a latent "resist image" (RI) therein. The resist image (RI) can be defined as a spatial (2D or 3D) distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it may be desirable to separate the optical properties of the patterning device from the optical properties of the rest of the lithographic projection apparatus including at least the source and the projection optics.

Figure 2:
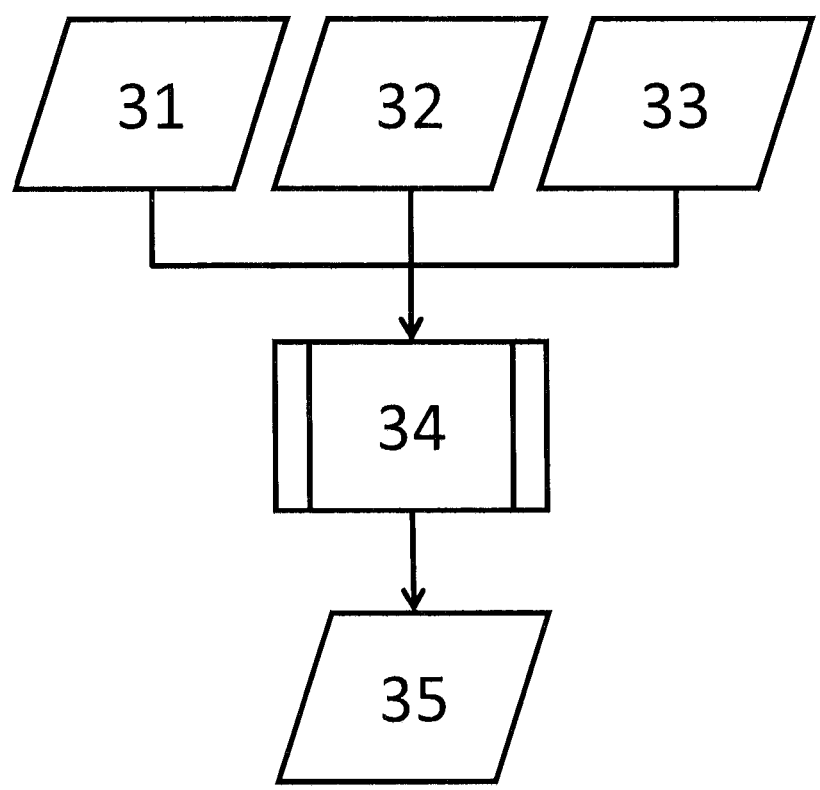
FIG. 2 shows a flow chart for simulating lithography in a lithographic projection apparatus.

An exemplary flow chart for simulating lithography in a lithographic projection apparatus is illustrated in FIG. 2. Characteristics 31 (e.g., radiation intensity distribution and phase distribution) of the source, characteristics 32 (e.g., changes to the radiation intensity distribution and to the phase distribution caused by the projection optics) of the projection optics, and characteristics 33 (e.g., changes to the radiation intensity distribution and to the phase distribution caused by an arrangement of features on or formed by the patterning device that represent a given design layout) of the patterning device are provided to a process model 34 as inputs thereto. The process model 34 may have other inputs, such as characteristics of exposure procedures including dose and focus, or such as characteristics of post-exposure procedures including development, PEB and etching. The process model 34 simulates, using these inputs, characteristics 35 (e.g., contours and CDs) of a product of the lithography (e.g., an aerial image, resist image or etched image). Examples of the characteristics 35 may include a process window of a feature of the design layout, a statistical parameter such as the standard deviation of a feature at multiple locations.

More specifically, it is noted that the characteristics 31 can include the optical characteristics of the source that include, but not limited to, numerical aperture settings, illumination sigma (σ) settings as well as any particular illumination shape (e.g. off-axis radiation sources such as annular, quadrupole, dipole, etc.). The characteristics 32 can include the optical characteristics of the projection optics, including aberration, distortion, one or more refractive indexes, one or more physical sizes, one or more physical dimensions, etc. The characteristics 33 can include one or more physical properties of a physical patterning device, as described, for example, in U.S. Pat. No. 7,587,704, which is incorporated by reference in its entirety. The simulation can predict, for example, edge placement, aerial image intensity slope and/or CD, which can then be compared against an intended design. The intended design is generally defined as a pre-OPC design layout which can be provided in a standardized digital file format such as GDSII or OASIS or other file format.

Figure 3:
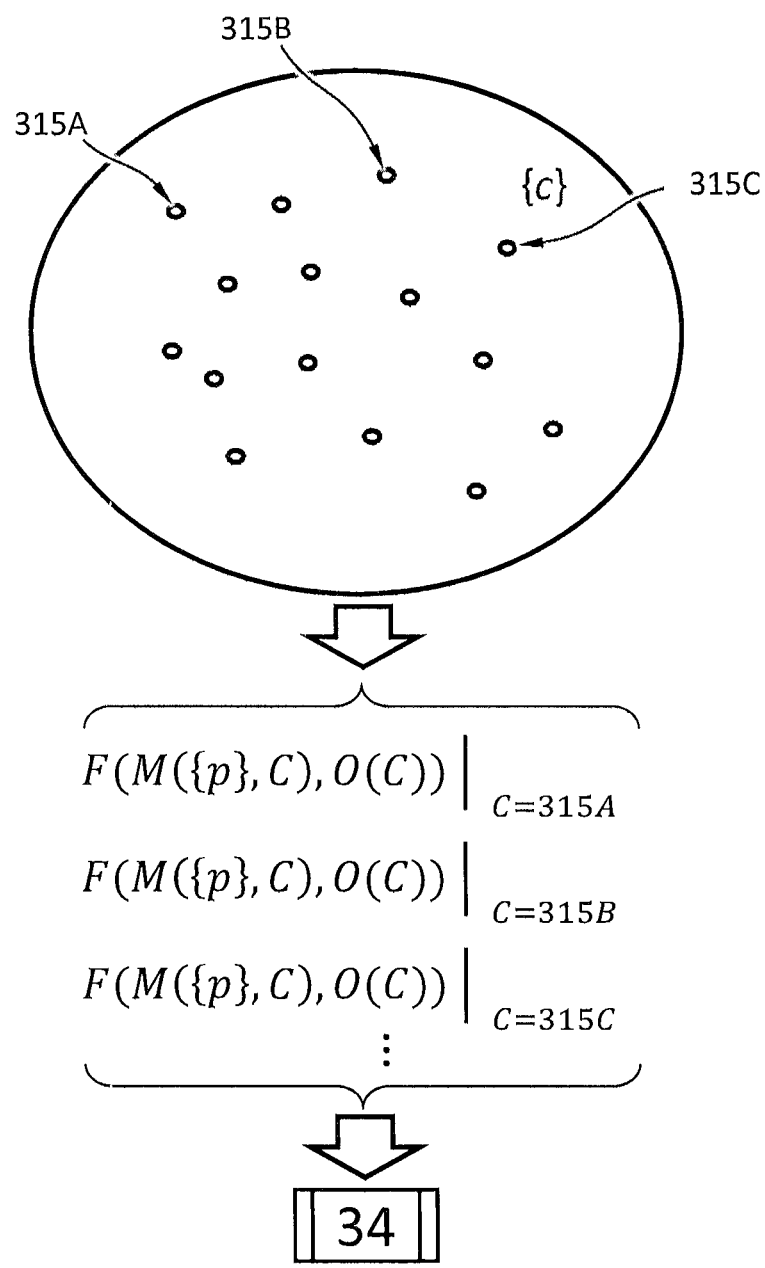
FIG. 3 schematically shows that for each of the processing conditions in a set, a deviation between the simulated characteristics and the measured characteristics under that processing condition is determined and used for determining the values of the parameters of a process model.

The process model 34 may have one of many possible forms. In each form, the process model 34 may have one or more parameters. The values of the parameters may be determined from deviations between the characteristics 35 simulated by the process model 34 ("simulated characteristics") and the characteristics 35 measured from a physical substrate ("measured characteristics") under the same processing conditions (e.g., represented by sets of values of the inputs of the process model 34). For example, the deviations may be differences between a CD simulated by the process model 34 and the CD actually measured on a physical substrate produced under the same processing conditions as used in the simulation. In an example, determining the values of the parameters may be reduced to finding the values of the parameters $\{p\}$ of the process model 34 that cause a cost function $CF1(\{p\}) = \Sigma_{C \in \{c\}} F(M(\{p\}, C), O(C))$ to be at a local or global extremum. C is a processing condition, which may be represented by a set of values of the inputs of the process model 34; $\{c\}$ is a set of processing conditions; $M(\{p\}, C)$ is the simulated characteristics under the processing condition C; $O(C)$ is the measured characteristics measured from a substrate produced under the processing condition C; F is the deviation between the simulated characteristics and the measured characteristics under the processing condition C. An example of F may be $(M(\{p\}, C) - O(C))^2$. FIG. 3 schematically shows that for each of the processing conditions 315A, 315B and 315C . . . that are members of the set $\{c\}$, the deviation F is determined and used for determining the values of the parameters $\{p\}$ of the process model 34.

Any changes in the values of the inputs (i.e., any changes in the processing condition represented by the inputs) may affect the simulated characteristics and measured characteristics. Examples of such changes may include a change in the dimension of a pattern in the design layout, a change in the source, a change in the projection optics, and a change in a post-exposure procedure (e.g., development and PEB). If the set of processing conditions $\{c\}$ is not representative (e.g., the set of processing conditions $\{c\}$ has very few members), the process model 34 constructed using the set of processing conditions $\{c\}$ may have large errors, especially when the process model 34 is used with inputs that are not sufficiently represented in $\{c\}$.

Increasing the size of the set of processing conditions $\{c\}$ will certainly improve its representativeness but also will increase the amount of computation needed for the construction of the process model 34.

Figure 4:
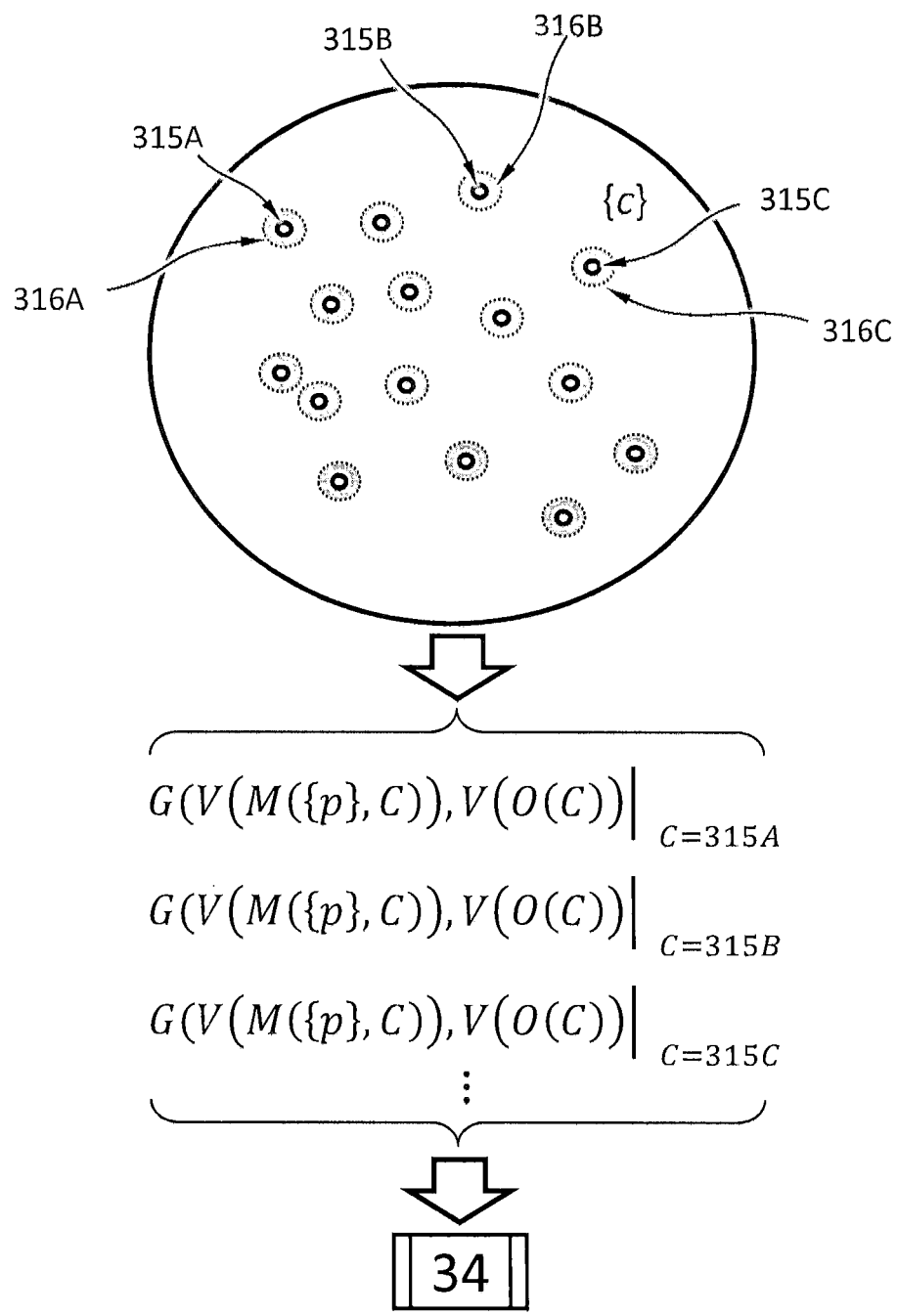
FIG. 4 schematically shows that for each of the processing conditions in a set, a deviation between variations of the simulated characteristics and the measured characteristics is determined in the vicinity of that processing condition and used for determining the values of the parameters of the process model.

In an embodiment, a deviation between a variation of the simulated characteristics and a variation of the measured characteristics among processing conditions (e.g., in the vicinity such as ±10% of a processing condition), alone or with the deviations between the simulated characteristics and the measured characteristics under the same processing conditions, may be used to determine the values of the parameters of the process condition 34. This is because a good process model 34 should accurately model not only the characteristics 35 under several processing conditions but also the variations of the characteristics 35 around these processing conditions. For example, the deviation may be a difference between the standard deviation of a CD simulated by the process model 34 for a group of processing conditions and the standard deviation of the CD actually measured on physical substrates produced under the same group of processing conditions. In an example, determining the values of the parameter may be reduced to finding the values of the parameters $\{p\}$ of the process model 34 $M(\{p\}, C)$ that cause a cost function $CF2(\{p\}) = \Sigma_{C \in \{c\}} G(V(M(\{p\}, C)), V(O(C)))$ to be at a local or global extremum. C is a processing condition (e.g., a nominal processing condition), which may be represented by a set of values of the inputs of the process model 34; $\{c\}$ is a set of processing conditions; $M(\{p\}, C)$ is the simulated characteristics under the processing condition C; $O(C)$ is the measured characteristics measured from a substrate produced under the processing condition C; $V(M(\{p\}, C))$ and $V(O)C))$ are respectively the variations of the simulated characteristics and the measured characteristics among the processing conditions in the vicinity of the processing condition C. G is the deviation between the variations $V(M(\{p\}, C))$ and $V(O(C))$. An example of G may be $(V(M(\{p\}, C)) - V(O(C)))^2$. In another example, the variations V may be curvatures of two Bossung curves, and the deviation G may be a difference between these curvatures. FIG. 4 schematically shows that for each of the processing conditions (315A, 315B and 315C . . . ) that are members of the set $\{c\}$, the deviation G is determined in the vicinity (316A, 316B, or 316C . . . ) of that processing condition and used for determining the values of the parameters of the process model 34.

In an example, determining the values of the parameter may be reduced to finding the values of the parameters $\{p\}$ of the process model 34 $M(\{p\}, C)$ that cause a combination of CF1 and CF2 to be at a local or global extremum.

The values of the parameters $\{p\}$ of the process model 34 may be determined using an algorithm such as the Gauss-Newton algorithm, the Levenberg-Marquardt algorithm, the Broyden-Fletcher-Goldfarb-Shanno algorithm, the gradient descent algorithm, the simulated annealing algorithm, the interior point algorithm, and the genetic algorithm.

Figure 5A:
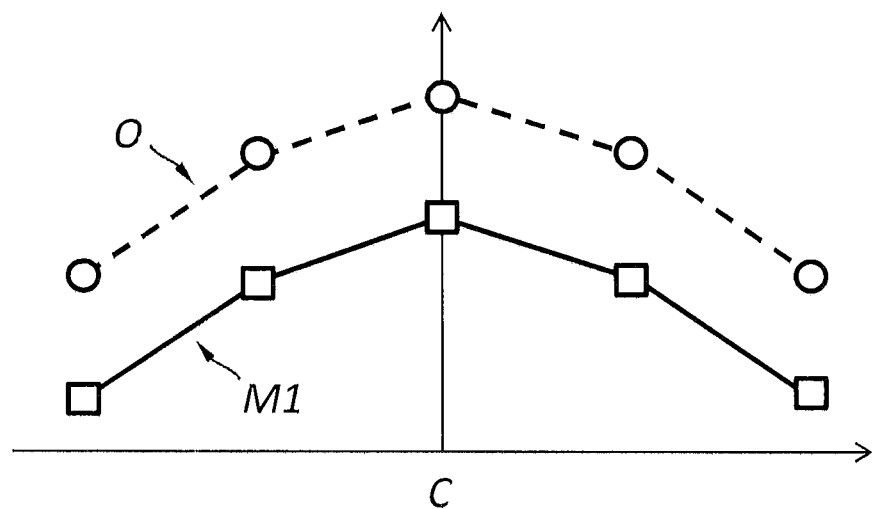
FIG. 5A schematically shows the measured characteristics (the curve labeled "O") and the simulated characteristics (the curve labeled "M1") by a process model M1 in the vicinity of a processing condition.
Figure 5B:
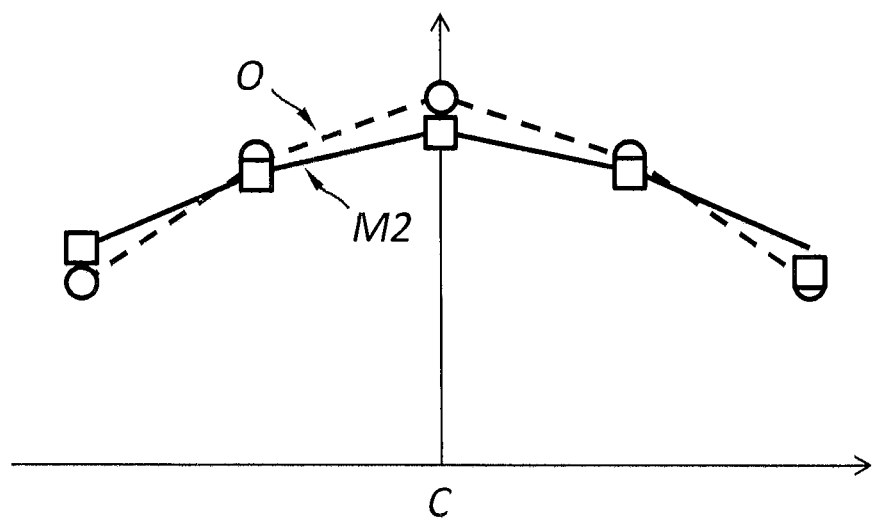
FIG. 5B schematically shows the measured characteristics (the curve labeled "O") and the simulated characteristics (the curve labeled "M2") by a process model M2 in the vicinity of a processing condition.

FIG. 5A schematically shows the measured characteristics (the curve labeled "O") and the simulated characteristics (the curve labeled "M1") by a process model M1 in the vicinity of a processing condition C. In this example, the deviations between the simulated characteristics and the measured characteristics under the same processing conditions are large; the deviations between a variation of the simulated characteristics and a variation of the measured characteristics under the same variation of the processing conditions are small. Namely, the cost function CF1 would be large but the cost function CF2 would be small. FIG. 5B schematically shows the measured characteristics (the curve labeled "O") and the simulated characteristics (the curve labeled "M2") by a process model M2 in the vicinity of the processing condition C. In this example, the deviations between the simulated characteristics and the measured characteristics under the same processing conditions are small; the deviations between a variation of the simulated characteristics and a variation of the measured characteristics under the same variation of the processing conditions are large. Namely, the cost function CF1 would be small but the cost function CF2 would be large. Neither the process model M1 nor the process model M2 is very accurate. When the parameters of a process model are determined using a combination of the cost functions CF1 and CF2, both types of deviations may be reduced.

The process model 34 may have many parameters {p}. Determining these many parameters {p} using one cost functions (e.g., CF1, CF2, or a combination of CF1 and CF2) may trap the parameters in local extrema. In an embodiment, the parameters {p} of the process model 34 may be determined using many cost functions. For example, these cost functions may be combinations of multiple deviations F between the simulated characteristics and the measured characteristics under multiple processing conditions C, and multiple deviations G between the variations of the simulated characteristics and the variations of the measured characteristics (e.g., among processing conditions in the vicinity of the processing condition C). These deviations F and deviations G may be at a plurality of different processing conditions. Some of the deviations F and deviations G may be chosen to be sensitive to only a subset of the parameters {p}.

Figure 6A:
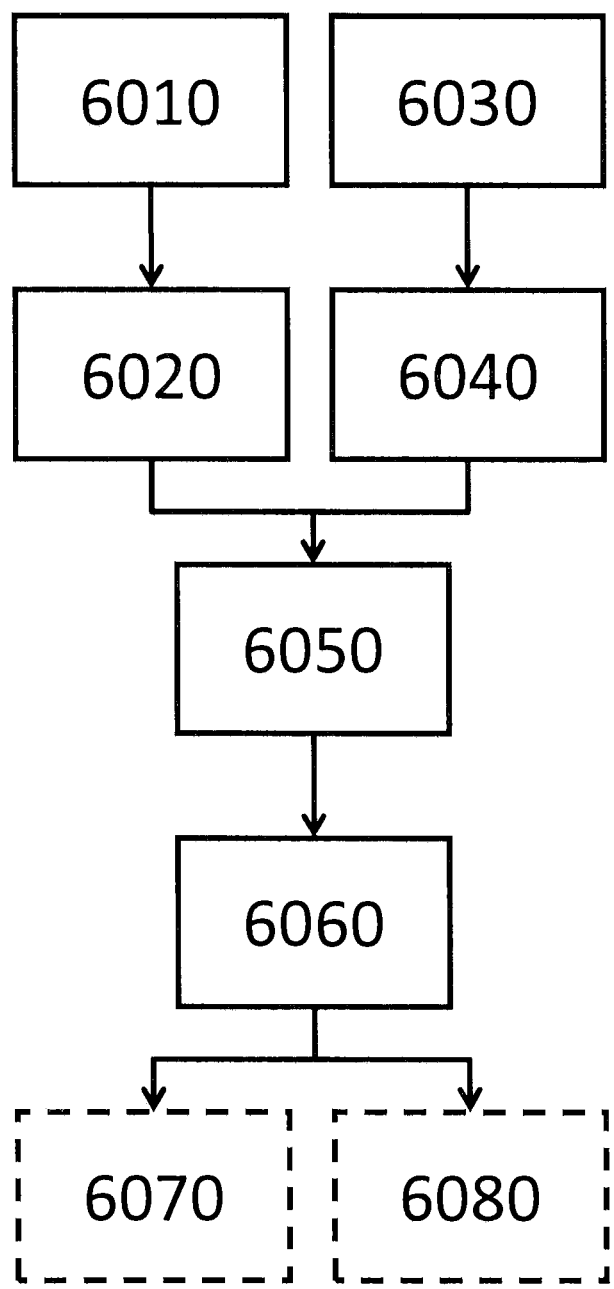
FIG. 6A schematically shows a flow chart for constructing a process model, according to an embodiment.

FIG. 6A schematically shows a flow chart for constructing a process model, according to an embodiment. In procedure 6010, simulated characteristics are obtained by simulating the characteristics 35 under a plurality of processing conditions, using the process model 34, which has a plurality of parameters. The plurality of processing conditions may be selected randomly. The plurality of processing conditions may be within a range that includes a nominal processing condition. In procedure 6020, a variation of the simulated characteristics is determined. In procedure 6030, measured characteristics are obtained by measuring the characteristics 35 from patterns produced under the plurality of processing conditions, for example, by using a metrology tool. In procedure 6040, a variation of the measured characteristics is determined. In procedure 6050, a deviation between the variations is determined. Examples of the variations may include standard deviation, variance, range, or any other quantity that describes differences among the simulated or measured characteristics. In procedure 6060, the parameters of the process model 34 are adjusted at least partially based on the deviation. Adjusting the parameters based on the deviation may comprise determining values of the parameters that cause a function of the deviation to be at a local or global extremum. The parameters of the process model 34 may be adjusted based on a combination of the deviation determined in procedure 6050 and a deviation between the simulated characteristics and the measured characteristics under a same processing condition. In optional procedure 6070, a processing condition (e.g., characteristics of the source, the projection optics, the patterning device, or a combination thereof) may be adjusted based on simulation by the process model 34 under the adjusted parameters. In optional procedure 6080, a group of locations on a substrate may be selected for inspection based on simulation by the process model 34 under the adjusted parameters.

Figure 6B:
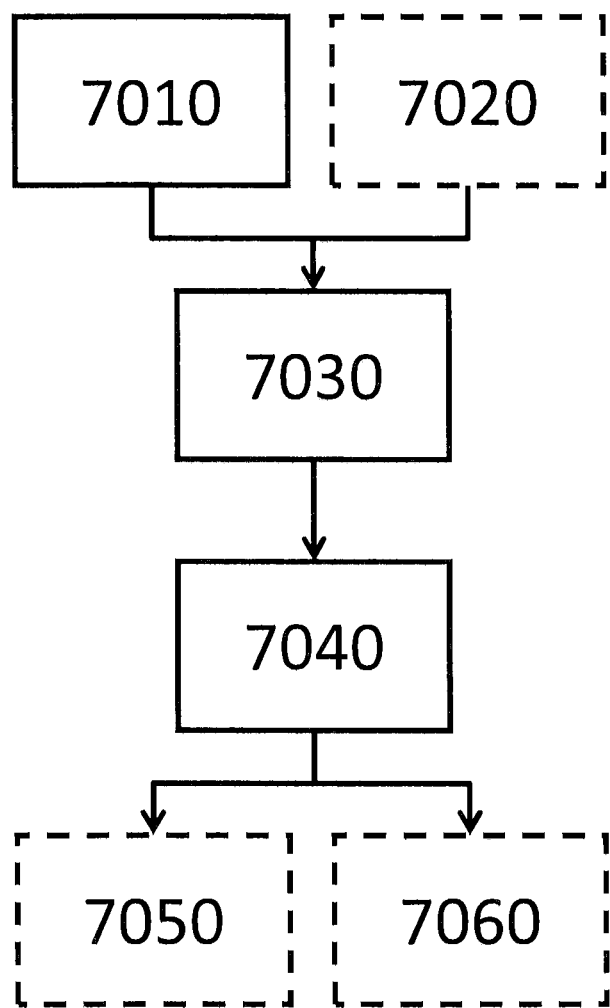
FIG. 6B schematically shows a flow chart for constructing a process model, according to an embodiment.

FIG. 6B schematically shows a flow chart for constructing a process model, according to an embodiment. In procedure 7010, a plurality of deviations are obtained, each of the deviations being between a variation of the simulated characteristics and a variation of the measured characteristics across the same set of processing conditions, for example, using procedures 6010-6050 in the flowchart of FIG. 6. In optional procedure 7020, one or more deviations between the simulated characteristics and the measured characteristics at the same processing conditions are obtained. In procedure 7030, a plurality of cost functions are constructed. The cost functions are combinations of the plurality of deviations between variations of the simulated characteristics and variations of the measured characteristics, and optionally the one or more deviations between the simulated characteristics and the measured characteristics at the same processing conditions. In an embodiment, at least one of the cost functions is not affected by all the parameters of the process model 34. In procedure 7040, the parameters of the process model 34 are adjusted by using the cost functions. For example, adjusting the parameters may comprise determining values of the parameters that cause the plurality of cost functions to be at local or global extrema. In optional procedure 7050, a processing condition (e.g., characteristics of the source, the projection optics, the patterning device, or a combination thereof) may be adjusted based on simulation by the process model 34 under the adjusted parameters. In optional procedure 7060, a group of locations on a substrate may be selected for inspection based on simulation by the process model 34 under the adjusted parameters.

Figure 7:
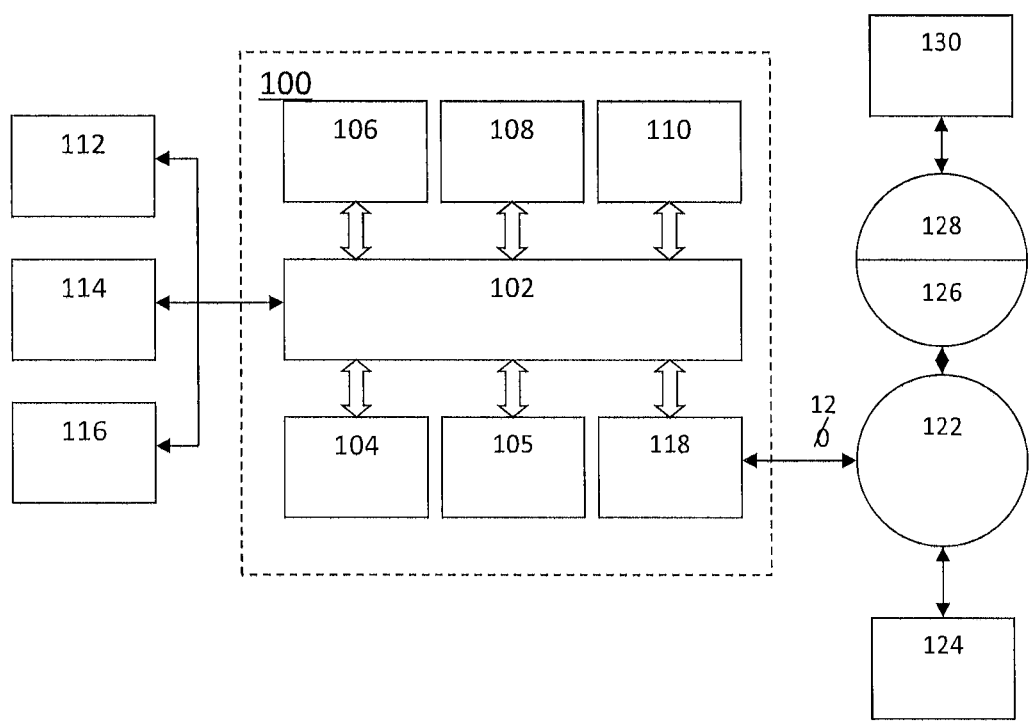
FIG. 7 is a block diagram of an example computer system.

FIG. 7 is a block diagram that illustrates a computer system 100 which can assist in implementing the methods, flows, apparatuses or systems disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of the optimization process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 8:
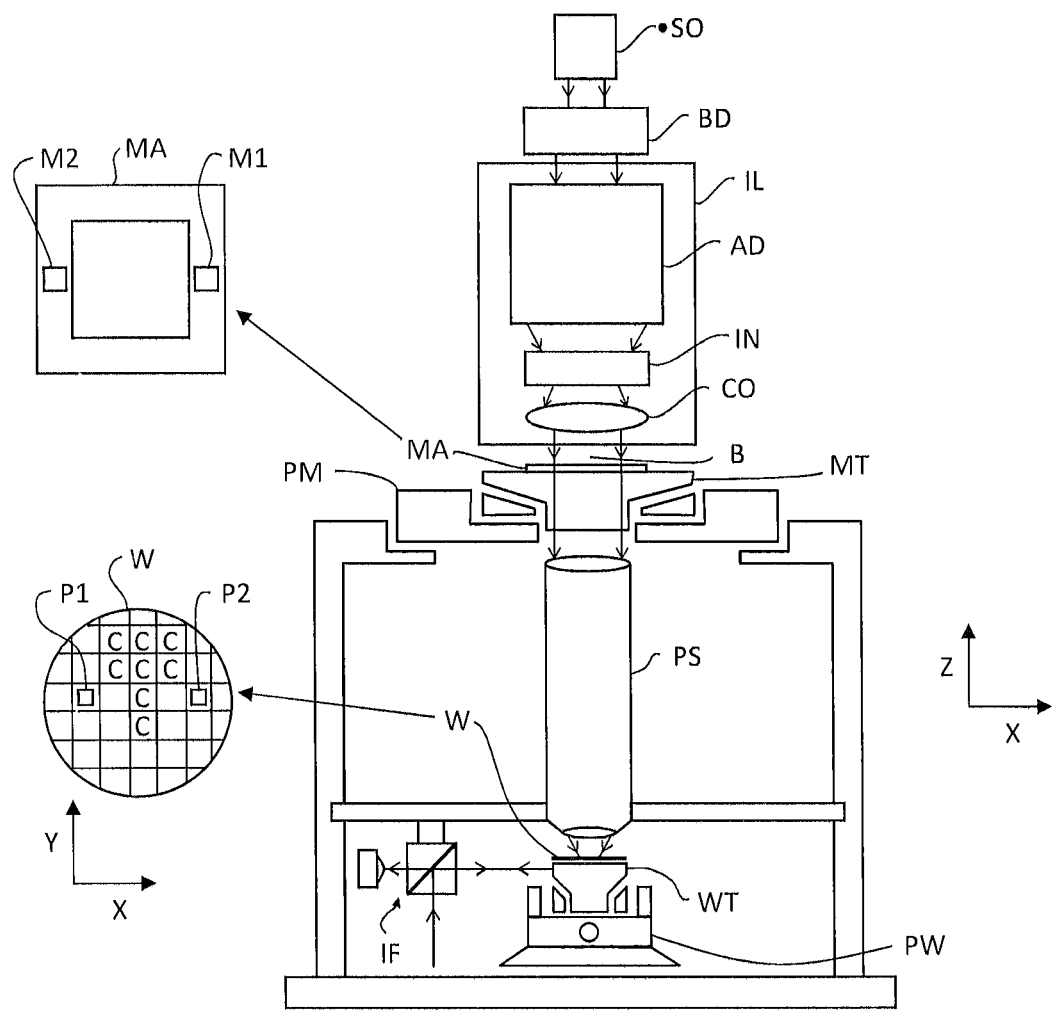
FIG. 8 is a schematic diagram of a lithographic projection apparatus.

FIG. 8 schematically depicts an exemplary lithographic projection apparatus whose illumination could be optimized utilizing the methods described herein. The apparatus comprises:

- an illumination system IL, to condition a beam B of radiation. In this particular case, the illumination system also comprises a radiation source SO;
- a first object table (e.g., patterning device table) MT provided with a patterning device holder to hold a patterning device MA (e.g., a reticle), and connected to a first positioner to accurately position the patterning device with respect to item PS;
- a second object table (substrate table) WT provided with a substrate holder to hold a substrate W (e.g., a resist-coated silicon wafer), and connected to a second positioner to accurately position the substrate with respect to item PS;
- a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 8 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 8. However, in the case of a stepper (as opposed to a step-and-scan tool) the patterning device table MT may just be connected to a short stroke actuator, or may be fixed.

The depicted tool can be used in two different modes:
  In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;
  In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 9:
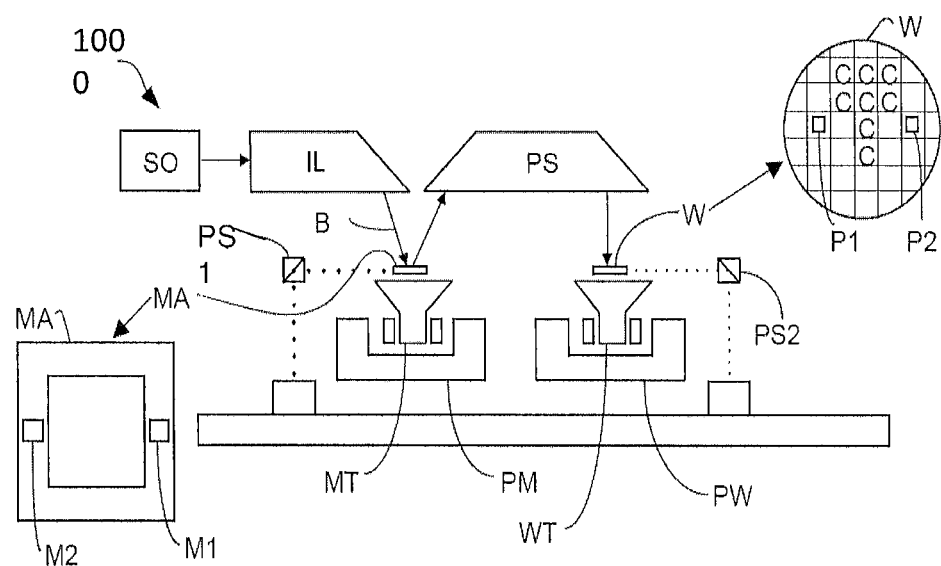
FIG. 9 is a schematic diagram of another lithographic projection apparatus.

FIG. 9 schematically depicts another exemplary lithographic projection apparatus 1000 whose illumination could be optimized utilizing the methods described herein.

The lithographic projection apparatus 1000 comprises:
  a source collector module SO
  an illumination system (illuminator) IL configured to condition a radiation beam B (e.g. EUV radiation).
  a support structure (e.g. a patterning device table) MT constructed to support a patterning device (e.g. a mask or a reticle) MA and connected to a first positioner PM configured to accurately position the patterning device;
  a substrate table (e.g. a wafer table) WT constructed to hold a substrate (e.g. a resist coated wafer) W and connected to a second positioner PW configured to accurately position the substrate; and
  a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 9, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 9, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil minor devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-) magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 10:
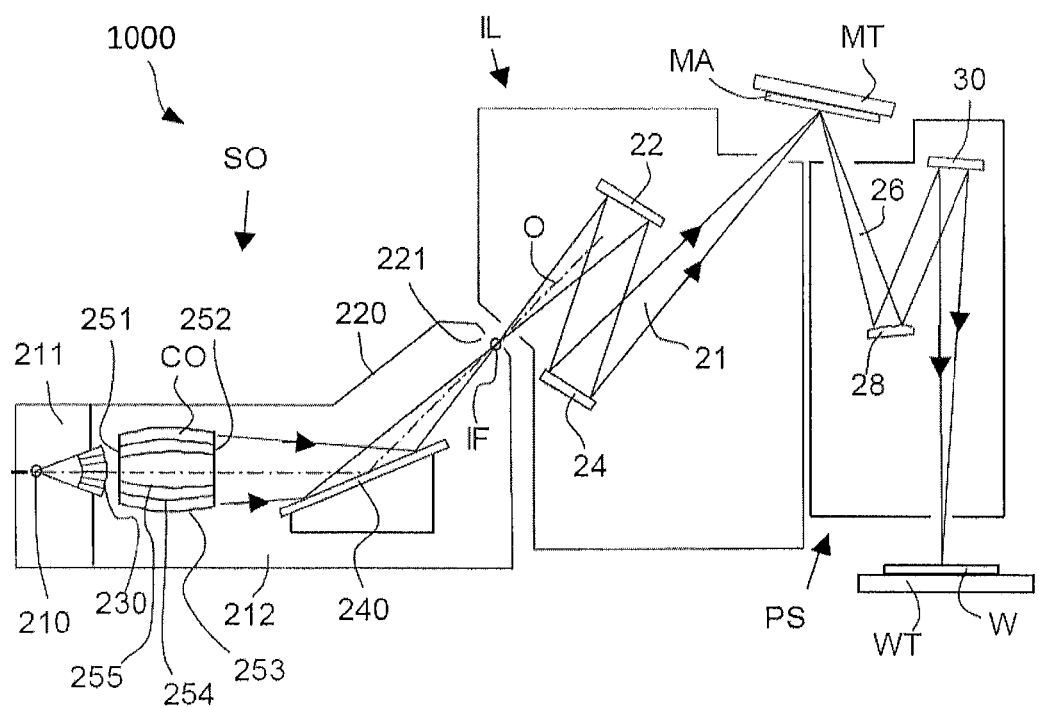
FIG. 10 is a more detailed view of the apparatus in FIG. 9.

FIG. 10 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 10.

Collector optic CO, as illustrated in FIG. 10, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 11:
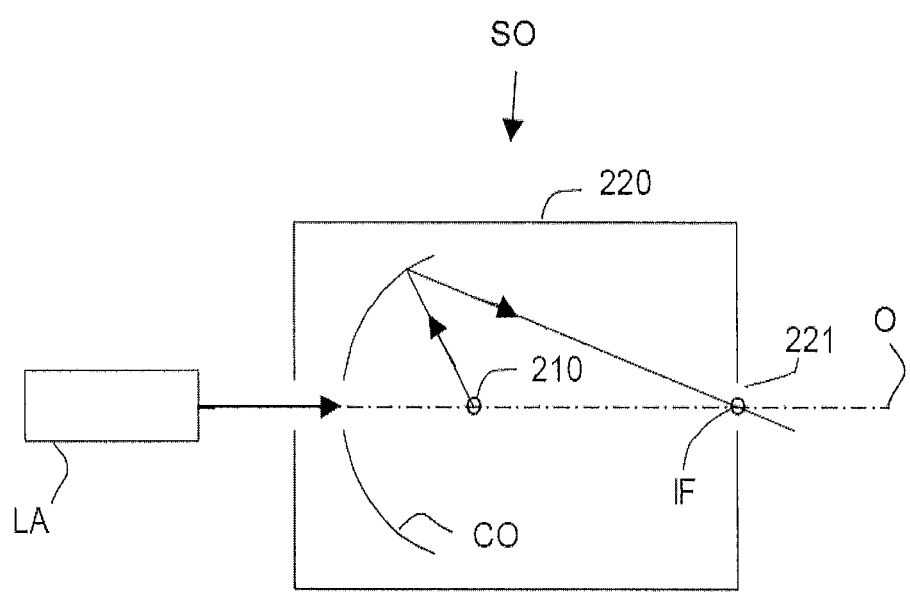
FIG. 11 is a more detailed view of the source collector module SO of the apparatus of FIG. 9 and FIG. 10.

Alternatively, the source collector module SO may be part of an LPP radiation system as shown in FIG. 11. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

U.S. Patent Application Publication No. US 2013-0179847 is hereby incorporated by reference in its entirety.

The embodiments may further be described using the following clauses:

1. A method comprising:
    obtaining simulated characteristics by simulating, under a plurality of processing conditions, characteristics of a product of lithography using a process model comprising a parameter,
    determining a variation of the simulated characteristics;
    obtaining measured characteristics by measuring the characteristics of the product, from patterns produced under the plurality of processing conditions;
    determining a variation of the measured characteristics;
    determining a first deviation between the variation of the simulated characteristics and the variation of the measured characteristics; and
    adjusting the parameter based on the first deviation.

2. The method of clause 1, further comprising adjusting a processing condition based on simulation by the process model.
3. The method of clause 1, further comprising selecting a group of locations for inspection on a substrate produced by the lithography based on simulation by the process model.
4. The method of any one of clauses 1-3, wherein the plurality of processing conditions are selected randomly.
5. The method of any one of clauses 1-3, wherein the plurality of processing conditions comprise a nominal processing condition.
6. The method of any one of clauses 1-5, wherein the variation of the measured characteristics is selected from a group consisting of a standard deviation of the measured characteristics, a variance of the measured characteristics, and a range of the measured characteristics.
7. The method of any one of clauses 1-6, wherein the variation of the simulated characteristics is selected from a group consisting of a standard deviation of the measured characteristics, a variance of the measured characteristics, and a range of the measured characteristics.
8. The method of any one of clauses 1-7, wherein adjusting the parameters comprises determining values of the parameters that cause a function of the first deviation to be at a local or global extremum.
9. The method of any one of clauses 1-8, wherein adjusting the parameter is based on a combination of the first deviation, and a second deviation between the simulated characteristics and the measured characteristics under a same processing condition.
10. The method of any one of clauses 1-9, wherein the plurality of processing conditions comprise a characteristic of a source of a lithographic apparatus, a characteristic of projection optics of a lithographic apparatus, and a characteristic of a patterning device with an arrangement of features thereon that represent a design layout.
11. The method of any one of clauses 1-10, wherein the characteristics of the product comprise a characteristic of an image.
12. The method of clause 11, wherein the image is an aerial image, a resist image or an etched image.
13. The method of any one of clauses 1-12, wherein the characteristics of the product comprise a process window of a feature of a design layout.
14. The method of any one of clauses 1-13, wherein the characteristics of the product comprise a statistical parameter of a feature at a plurality of locations.
15. A method comprising:
obtaining a plurality of first deviations, each of which being between a variation of simulated characteristics of a product of lithography and a variation of measured characteristics of the product of lithography, wherein the simulated characteristics are obtained by simulating characteristics of the product using a process model comprising a parameter;
constructing a plurality of cost functions, the cost functions being combinations of the plurality of first deviations; and
adjusting the parameter of the process model by using the cost functions.

16. The method of clause 15, further comprising adjusting a processing condition based on simulation by the process model.
17. The method of clause 15, further comprising selecting a group of locations for inspection on a substrate produced by the lithography based on simulation by the process model.
18. The method of any one of clauses 15-17, wherein the variations are across a same set of processing conditions.
19. The method of any one of clauses 15-18, further comprising obtaining a second deviation between the simulated characteristics and the measured characteristics under a same processing condition, wherein the cost functions are combinations of the plurality of first deviations and the second deviation.
20. The method of any one of clauses 15-19, wherein at least one of the cost functions is not affected by all the parameters.
21. The method of any one of clauses 15-20, wherein adjusting the parameters comprises determining values of the parameters that cause the cost functions to be at local or global extrema.
22. The method of any one of clauses 15-21, wherein the characteristics of the product comprise a characteristic of an image.
23. The method of clause 22, wherein the image is an aerial image, a resist image or an etched image.
24. The method of any one of clauses 15-23, wherein the characteristics of the product comprise a process window of a feature of a design layout.
25. The method of any one of clauses 15-24, wherein the characteristics of the product comprise a statistical parameter of a feature at a plurality of locations.
26. A computer program product comprising a non-transitory computer readable medium having instructions recorded thereon, the instructions when executed by a computer implementing a method of any one of clauses 1-25.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:
1. A method comprising:
obtaining simulated characteristics by simulating, by a hardware computer system and under a plurality of processing conditions, characteristics of a product of lithography using a process model comprising a parameter;

determining a statistical variation of the simulated characteristics;

obtaining measured characteristics by measuring the characteristics of the product, from patterns produced under the plurality of processing conditions;

determining a statistical variation of the measured characteristics;

determining a first deviation between the statistical variation of the simulated characteristics and the statistical variation of the measured characteristics; and adjusting the parameter based on the first deviation.

2. The method of claim 1, further comprising adjusting a processing condition of manufacturing based on simulation by the process model.

3. The method of claim 1, further comprising selecting a group of locations for inspection on a substrate processed using the lithography based on simulation by the process model.

4. The method of claim 1, wherein the plurality of processing conditions are selected randomly.

5. The method of claim 1, wherein the plurality of processing conditions comprise a nominal processing condition.

6. The method of claim 1, wherein the statistical variation of the measured characteristics is selected from a group consisting of a standard deviation of the measured characteristics, a variance of the measured characteristics, and a range of the measured characteristics.

7. The method of claim 1, wherein the statistical variation of the simulated characteristics is selected from a group consisting of a standard deviation of the simulated characteristics, a variance of the simulated characteristics, and a range of the simulated characteristics.

8. The method of claim 1, wherein adjusting the parameter comprises determining a value of the parameter that causes a function of the first deviation to be at a local or global extremum.

9. The method of claim 1, wherein adjusting the parameter is based on a combination of the first deviation, and a second deviation between the simulated characteristics and the measured characteristics under a same processing condition.

10. The method claim 1, wherein the plurality of processing conditions comprise a characteristic of an illumination of patterning device by a lithographic apparatus, a characteristic of projection optics of a lithographic apparatus, and/or a characteristic of a patterning device with an arrangement of features thereon that represent a design layout.

11. The method of claim 1, wherein the characteristics of the product comprise a characteristic of an image.

12. The method of claim 1, wherein the characteristics of the product comprise a process window of a feature of a design layout.

13. The method of claim 1, wherein the characteristics of the product comprise a statistical parameter of a feature at a plurality of locations.

14. A method comprising:
obtaining a plurality of first deviations, each of which being between a statistical variation of simulated characteristics of a product of lithography and a statistical variation of measured characteristics of the product of lithography, wherein the simulated characteristics are obtained by simulating, by a hardware computer system, characteristics of the product using a process model comprising a parameter;

constructing a plurality of cost functions, the cost functions being combinations of the plurality of first deviations; and adjusting the parameter of the process model by using the cost functions.

15. The method of claim 14, further comprising adjusting a processing condition of manufacturing based on simulation by the process model.

16. A non-transitory computer-readable medium comprising instructions therein, the instructions, upon execution by a computer system, configured to cause the computer system to at least:

obtain a plurality of first deviations, each of which being between a statistical variation of simulated characteristics of a product of lithography and a statistical variation of measured characteristics of the product of lithography, wherein the simulated characteristics are obtained by simulating, by a hardware computer system, characteristics of the product using a process model comprising a parameter;

construct a plurality of cost functions, the cost functions being combinations of the plurality of first deviations; and adjust the parameter of the process model by using the cost functions.

17. A non-transitory computer-readable medium comprising instructions therein, the instructions, upon execution by a computer system, configured to cause the computer system to at least:

obtain simulated characteristics by computer simulation, under a plurality of processing conditions, of characteristics of a product of lithography using a process model comprising a parameter;

determine a statistical variation of the simulated characteristics;

obtain measured characteristics by measuring the characteristics of the product, from patterns produced under the plurality of processing conditions;

determine a statistical variation of the measured characteristics;

determine a deviation between the statistical variation of the simulated characteristics and the statistical variation of the measured characteristics; and adjust the parameter based on the deviation.

18. The computer-readable medium of claim 17, wherein the instructions are further configured to cause the computer system to adjust a processing condition of manufacturing based on simulation by the process model.

19. The computer-readable medium of claim 17, wherein the instructions are further configured to cause the computer system to select a group of locations for inspection on a substrate processed using the lithography based on simulation by the process model.

20. The computer-readable medium of claim 17, wherein the plurality of processing conditions are selected randomly.

* * * * *